United States Patent [19]

Ballato et al.

[11] 4,353,027

[45] Oct. 5, 1982

[54] CONTACTLESS RESISTIVITY MEASUREMENT METHOD AND APPARATUS

[75] Inventors: Arthur Ballato, Long Branch; Gerald J. Iafrate, Toms River, both of N.J.

[73] Assignee: The United States of America as represented by the Secretary of the Army, Washington, D.C.

[21] Appl. No.: 200,627

[22] Filed: Oct. 27, 1980

[51] Int. Cl.³ ............................................ G01R 29/22
[52] U.S. Cl. ..................................... 324/56; 324/62
[58] Field of Search ............................ 324/56, 62

[56] References Cited

U.S. PATENT DOCUMENTS

| | | | |
|---|---|---|---|
| 3,490,036 | 1/1970 | Grenier | 324/56 |
| 4,092,588 | 5/1978 | Desormiere et al. | 324/56 |
| 4,220,915 | 9/1980 | Kawamoto et al. | 324/62 X |
| 4,284,946 | 8/1981 | Sharrow | 324/56 |

FOREIGN PATENT DOCUMENTS

548801  3/1977  U.S.S.R. ................................ 324/56

*Primary Examiner*—Stanley T. Krawczewicz
*Attorney, Agent, or Firm*—Nathan Edelberg; Jeremiah G. Murray; Michael C. Sachs

[57] ABSTRACT

Methods and apparatus for contactless, non-destructive resistivity measurements on semiconducting crystalline material, for example gallium arsenide. The material to be tested is formed into a disc which is supported within an air gap. The holder for the disc is such as to support the disc only about its outer edges; thus, the disc is free to vibrate piezoelectrically. A measuring circuit connected to the electrodes, which establish the air gap, applies an alternating electric field in the air gap which causes the crystal to vibrate. By adjusting the frequency of excitation, resonance may be established in the crystal and by comparing the current drawn through the air gap with graphs previously established for material of the type under test, the resistivity of the disc can be determined.

14 Claims, 10 Drawing Figures

CONTACTLESS RESISTIVITY MEASUREMENT METHOD AND APPARATUS

GOVERNMENT LICENSE

The invention described herein may be manufactured and used by or for the Government, for governmental purposes, without the payment of any royalties thereon or therefor.

TECHNICAL FIELD

Broadly speaking, this invention relates to semiconducting, crystalline material. More particularly, in a preferred embodiment, this invention relates to non-destructive, contactless methods and apparatus for accurately measuring the resistivity of semiconducting crystalline material, for example piezoelectric, semiconducting crystals particularly those in cubic class $\overline{4}3$ m, which includes most of the II–VI and III–V compounds, such as gallium arsenide.

DISCUSSION OF THE PRIOR ART

There is presently great interest in accurately measuring the resistivity of high purity, semiconductor material, such as gallium arsenide. This latter material is especially important because the large band gap it exhibits renders it stable at high temperatures, while its large mobility permits high frequency devices to be made from the material. For example, microwave FET's typically use insulating GaAs as a substrate. The high resistivity necessary for such uses can be obtained by compensatory doping, but doping with impurities leads to diffusion problems; it is far better to use uncompensated GaAs for the substrate.

Measurement of the high resistivity values involved in these devices can be accomplished by monitoring the DC currents which are established when DC voltages are applied to the device via a system of probes or electrodes which are attached to the surface of the sample under measurement. Apart from the problem of stray fields and the very minute currents that flow, the attachments which are made to the surface of the device under test tend to interfere with the measurement because the surface of the crystal is disturbed during the measurement process. What is clearly needed, and what is supplied by the instant invention, is a contactless, high accuracy, resistivity measurement technique which is particularly well suited for the high resistivity regime.

For a more detailed discussion of this problem, see the article by L. J. van der Pauw in Philips Research Reports, Vol. 13, 1958, pp. 1–9, and Philips Technical Review, Vol. 20, 1958/1959, pp. 220–224.

The instant invention makes use of the fact that crystals in class $\overline{4}3$ m are piezoelectric in nature and can, hence, be made into acoustic resonators. That these materials are piezoelectric and that this property provides a mechanism for coupling to acoustic waves has been recognized, but piezoelectric semiconducting vibrators seem not to have been investigated before. See, for example, the article by A. R. Hutson, J. H. McFee and D. L. White entitled "Ultrasonic Amplification in CdS," Phys. Rev. Lett., Vol. 7, No. 6, Sept. 15, 1961, pp. 237–239, and the article by A. R. Hutson and D. L. White entitled "Elastic Wave Propagation in Piezoelectric Semiconductors," J. Appl. Phys. Vol. 33, January 1962, pp. 40–47, and the article by K. Blötekjaer and C. F. Quate, entitled "The Coupled Modes of Acoustic Waves and Drifting Carriers in Piezoelectric Crystals," Proceedings of the IEEE, Vol. 52, April 1964, pp. 360–377. See also the article by G. Arlt, entitled "Resonance-Antiresonance of Conducting Piezoelectric Resonators," J. Acoust. Soc. Am., Vol. 37, January 1965, pp. 151–157.

Now, piezoelectric resonators made from quartz, and other insulators, have been used for many years, and the underlying theory is highly developed. The present invention resulted after a transmission line equivalent circuit was synthesized for a piezoelectric, semiconducting, plate vibrator. The behavior of this structure at resonance is manifested by the immittance versus frequency characteristic, which yields the value for the equivalent circuit parameters—including the desired resistivity. As will be explained, the contactless nature of the resistivity measurement technique disclosed and claimed herein stems from the discovery that piezoelectric vibrators may be driven by an AC field in an air gap.

SUMMARY OF THE INVENTION

One of the more significant advantages of the instant invention is the contactless nature of the measurement process which insures that surface contamination and/or degradation of the sample under test is obviated, as is the need to remove deposited electrodes from the sample. The invention also provides an accuracy which is very high and which, moreover, increases with increasing resistivity and which is virtually immune to the influences of stray currents.

While it is anticipated that the instant invention will be used in connection with the characterization of high purity, semiconductive crystals, such as GaAs, it is not so limited. As will be explained, the resistivity of the crystal is measured without any electrodes or probes touching the surfaces of the crystal, thereby eliminating the possibility of surface contamination interfering with the desired measurement.

More particularly, in a preferred embodiment, the instant invention comprises a non-destructive, contactless method of measuring the resistivity of a semiconducting, crystalline material. The method comprises the steps of supporting a disc of the semiconducting crystalline material in an air gap in such a manner that the disc is free to vibrate, establishing an alternating electric field in the air gap thereby to cause the disc to vibrate piezoelectrically, adjusting the frequency of the alternating electric field to drive the disc into and beyond resonance, and comparing the current drawn by the disc with previously prepared characteristic graphs for the crystalline material, thereby to determine the resistivity of the sample.

To practice the above method, one illustrative apparatus comprises first and second spaced-apart electrodes, the electrodes defining an air gap therebetween, means for positioning a disc of the semiconductive material to be measured within the air gap, and means, connected to the electrodes, for establishing an alternating electric field in the air gap, the alternating electric field causing the disc to vibrate piezoelectrically, the field establishing means including means for measuring the current flowing through the air gap.

The invention, and its mode of operation, will be more fully understood from the following detailed description when taken with the appended drawings, in which:

DETAILED DESCRIPTION OF THE INVENTION

We shall first consider a disc of semiconductor material and the apparatus necessary to drive the disc in at least one thickness mode of vibration. One skilled in the art will appreciate that the invention is equally applicable to samples using other modes of vibration; however, planar technology indicates that the thin disc is the most desirable for measurement purposes since most of the devices which will be fabricated from this semiconductor will be in the form of integrated circuits. As is well known, such integrated circuits are typically manufactured from semiconductor wafers. Hence, the use of discs in the measurement process is seen to be most appropriate.

Figure 1:
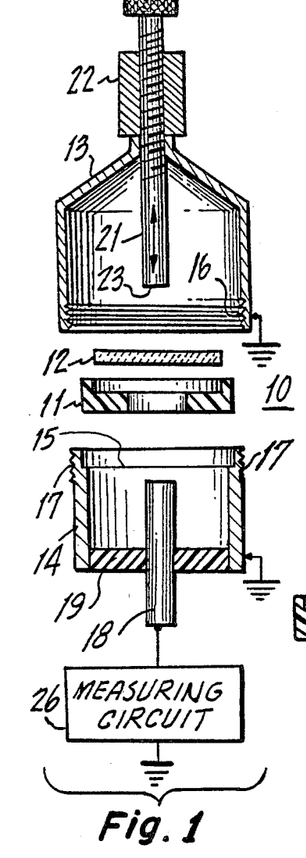
FIG. 1 is an exploded, cross-sectional view, of an illustrative air gap holder according to the invention.

FIG. 1 depicts an illustrative air gap device with crystal disc vibrator, according to the invention. As shown, device 10 comprises a non-conducting, e.g. Teflon ®, sample holder 11 which supports the semiconductor disc 12 to be measured about the outer edges thereof. Holder 11 and disc 12 are received within an upper coaxial member 13 and a lower coaxial member 14, respectively having male and female threads 16 and 17 formed therein for mating engagement about holder 11. In lower member 14, a first central conductor 18 if fixedly mounted by means of a non-conducting, cylindrical support 19. In like fashion, in upper member 13, a second central conductor 21 is supported by a micrometer head assembly 22. Head assembly 22 is fastened to the upper end of coaxial member 13; thus, as micrometer head 22 is rotated, the lower end 23 of center conductor 21 moves towards, or away from, disc 12 to alter the dimensions of the air gap. Coaxial members 13 and 14 are grounded and the lower end of central conductor 18 is connected to some suitable measuring circuit 26. It will be appreciated that holder 11 may be manufactured in a variety of sizes to accommodate different sizes of crystal discs.

In operation, when the upper member 13 with the micrometer head 22 attached thereto is screwed down over the lower member 14, holder 11 is retained within the two mated members and supported by shelf 15 of lower coaxial member 14. Crystal 12 is thus completely shielded from stray fields and is supported only at its outer edges. When measuring circuit 26 is energized, the crystal will be excited by the electric field produced between electrodes 18 and 21, neither of which actually touches the crystal. As has been discussed, the lower air gap is fixed by the position of support 11 on shelf 15, and the position of lower electrode 18, but the upper air gap is adjustable, by means of micrometer head 22.

FIG. 1 shows the preferred arrangement for measuring a semiconductor as a piezoelectric resonator. However, if desired, the provision of a simple mechanical movement permits the upper and lower electrodes to traverse laterally. This makes it possible to test different portions of the same disc to verify homogeneity.

Now, it is known that finite electrodes produce only a localized disturbance in a plate resonator in certain frequency regions. This is know as "energy trapping." In the instant invention, the trapping is due to the piezoelectric effect but, by making use of this effect, different regions of a disc can be tested in a continuous manner as the electrodes are translated along the sample, or as the sample is moved between the electrodes. In this way, the distribution of resistivity values around the disc area can be checked.

Figure 2:
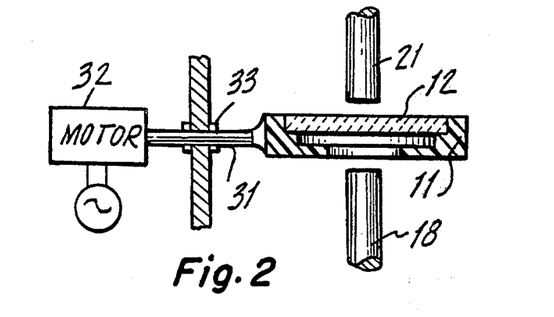
FIG. 2 is a partial, cross-sectional view of an alternative embodiment of the invention in which the crystal under test is moved relative to the air gap.
Figure 3:
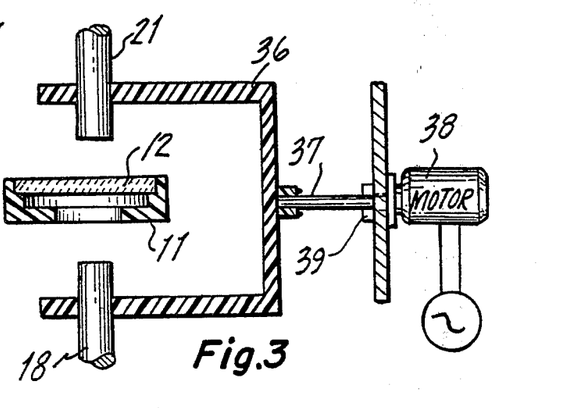
FIG. 3 is a partial, cross-sectional view of another alternative embodiment of the invention in which the air gap is moved relative to the crystal.

Such an arrangement is shown in FIGS. 2 and 3. In FIG. 2, for example, electrodes 21 and 18 are held stationary but holder 11 and disc 12 are free to move by means of a lead screw 31 which is driven by a motor 32. Lead screw 31 is journaled at 33 in the wall of either member 13 or member 14. In FIG. 3, on the other hand, the holder 11 and disc 12 are held stationary but electrodes 21 and 18 are free to move by virtue of their mounting in a non-conducting support member 36 which itself is fastened to a lead screw 37 which is driven by a motor 38. Again, lead screw 37 is journaled at 39 to the wall of either member 13 or member 14.

Figure 4:
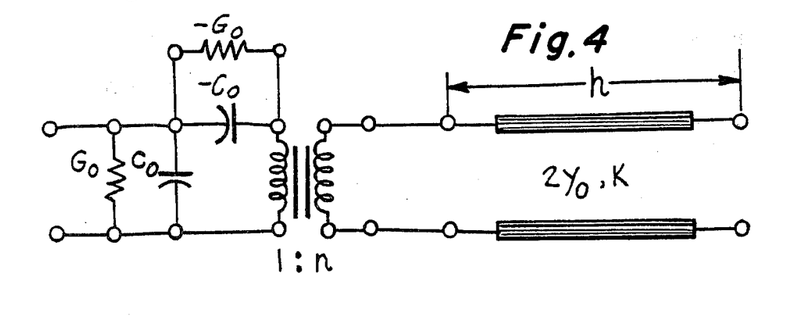
FIG. 4 is a circuit diagram of the equivalent circuit of the crystal under test.

In FIG. 1, the lower electrode is shown connected to some suitable electrical measuring circuit 26. This may be, for example, an oscillator, such as a CI-meter; a transmission measuring circuit; or an electrical bridge. Insofar as the measuring circuit is concerned, the mechanically vibrating semiconductor 12 appears to have the equivalent electrical network shown in FIG. 4. The resistivity is manifested in four places: the two elements $G_0$, the mechanical admittance $Y_0$ and the wave number $\kappa$; the influence of resistivity on $Y_0$ and $\kappa$ is almost always negligible, but the elements $G_0$ are inversely proportional to resistivity. As the frequency applied to the crystal causes the crystal to approach resonance, the real and imaginary parts of the immittance vary over wide ranges. The spacings of the critical frequencies associated with resonance, and the values of the real and imaginary parts of the input immittance of the crystal vibrator are strongly dependent on $G_0$ and hence on the resistivity of the sample. This is the very heart of the instant invention. The relationships involved are all contained in the network shown in FIG. 4 implicity, and it will not be given here explicitly. Suffice it to say that $G_0$ will change the Q of the resonance (and other features as well) and, as is well known, Q measurements are very sensitive to small changes in loss (resistivity) especially for high resistivity values.

One skilled in the art will appreciate that the instant invention may readily be adapted for use in conjunction with computer data logging, and can also easily be automated, if desired.

Figure 5:
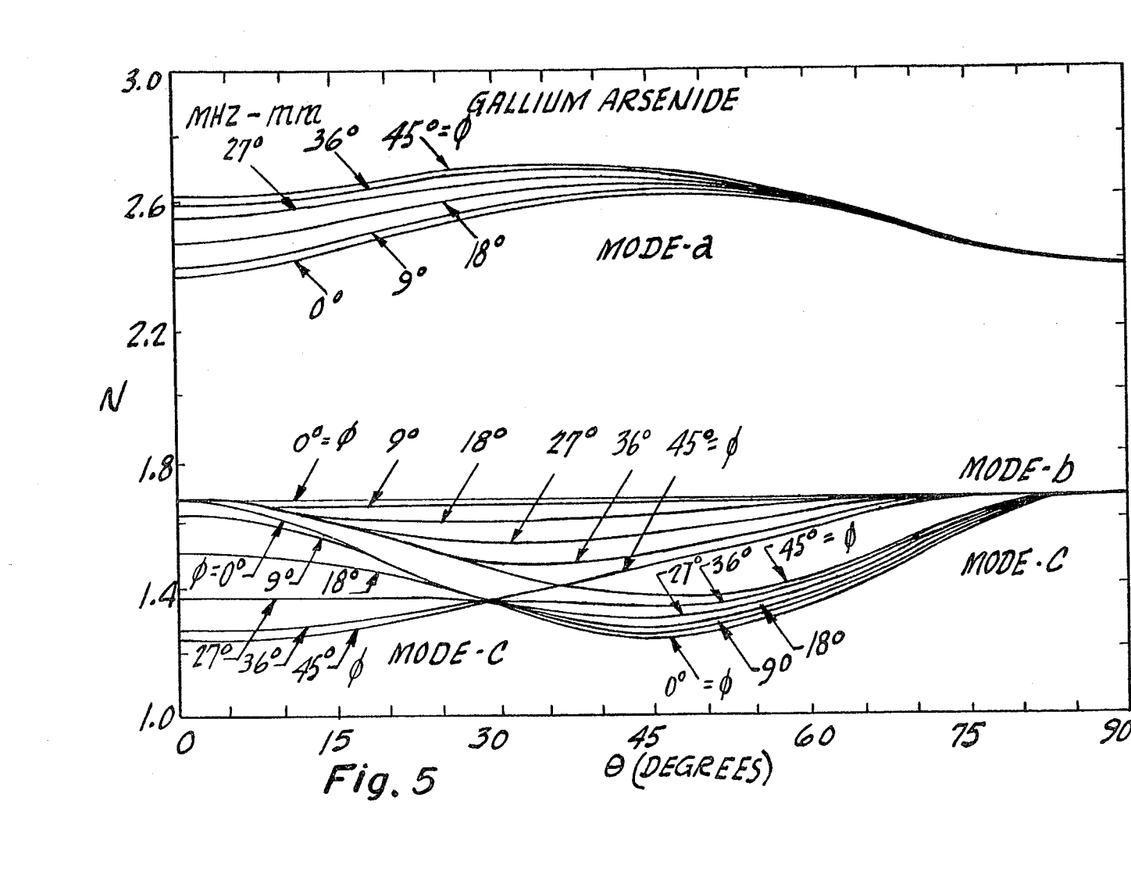
FIGS. 5-8 are graphs depicting various physical properties of GaAs as a function of the crystal cut, measured in degrees.
Figure 6:
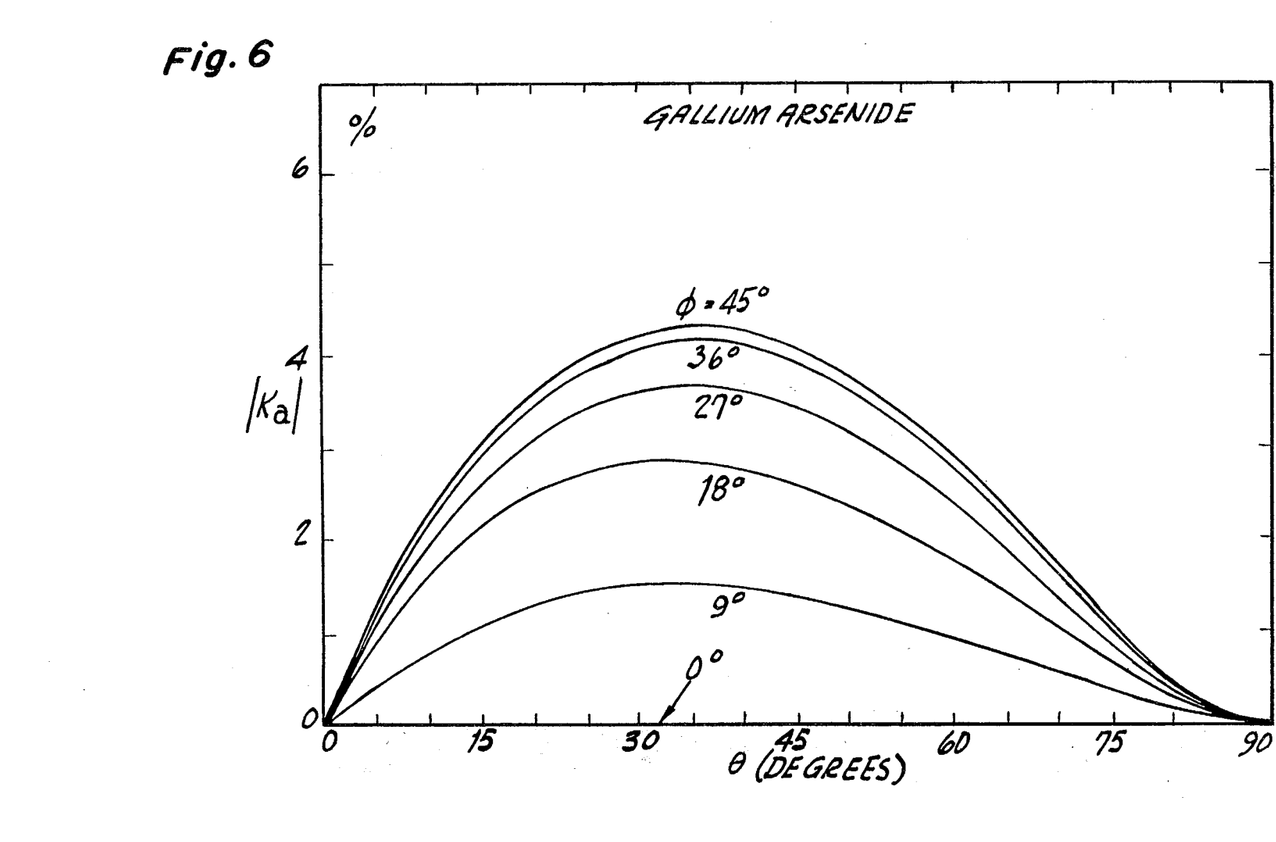
Figure 7:
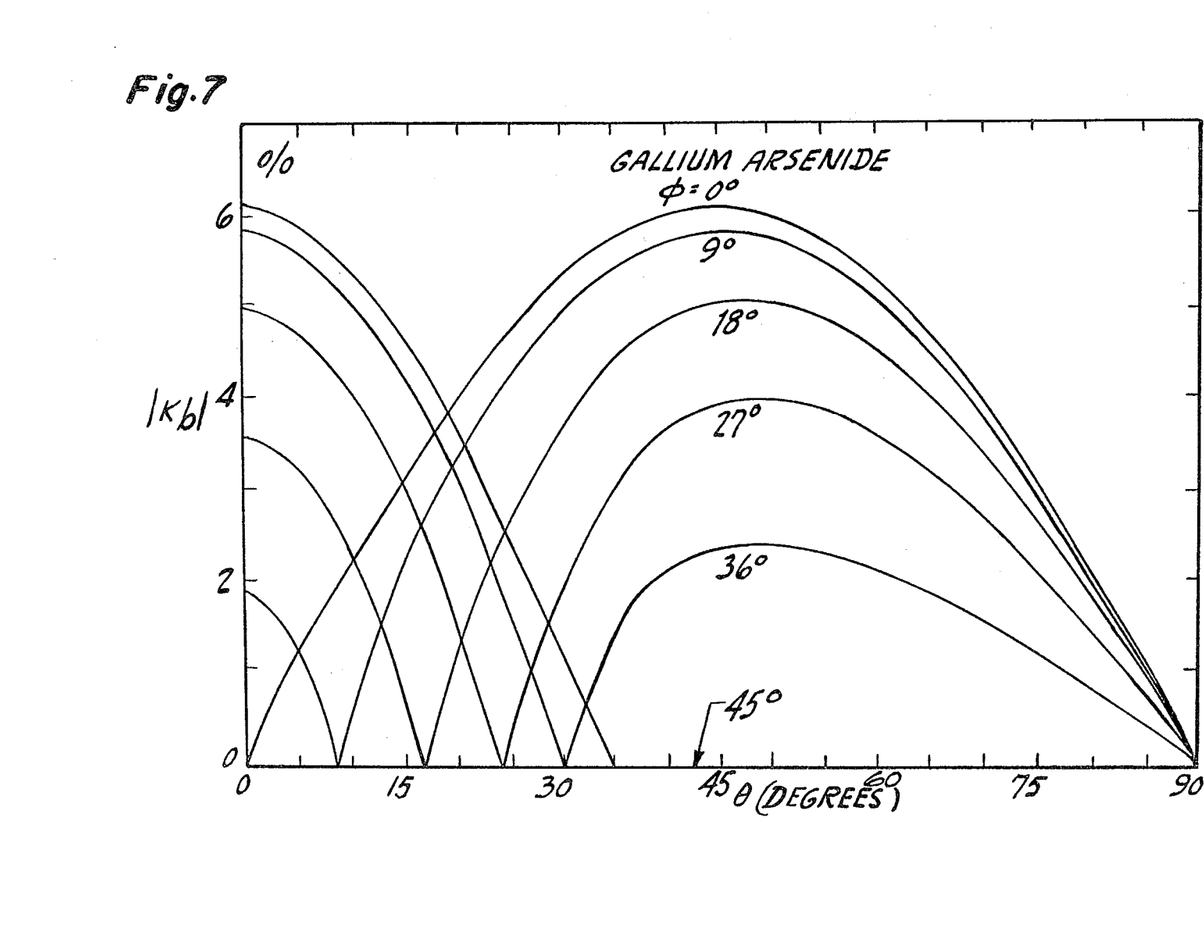
Figure 8:
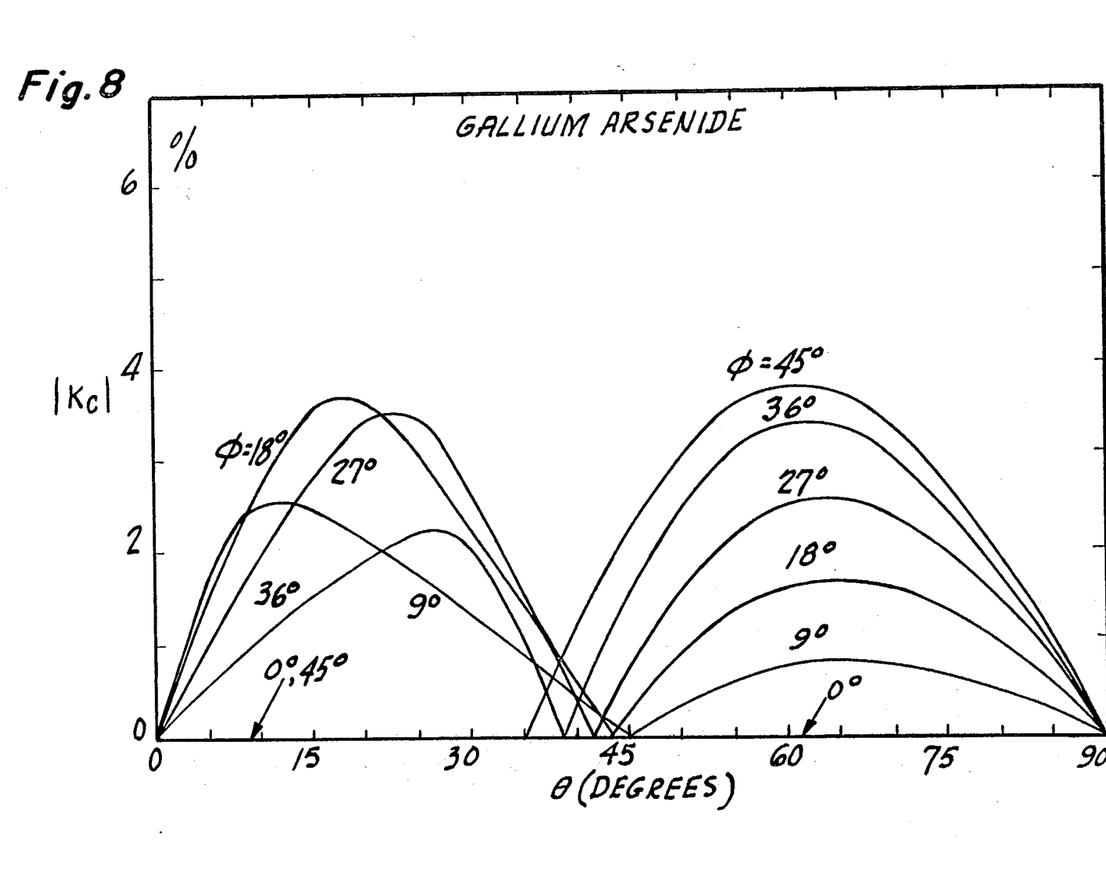

For materials in crystal class $\overline{4}3$ m, all second rank tensors are isotropic and this includes the resistivity tensor. The effective frequency constants (½ of the acoustic velocities) for the thickness modes, and the effective piezoelectric coupling factors are not isotropic, but depend on orientation. FIG. 5 shows the three frequency constants $N_m$ for modes m=a (quasi-longitudinal), b (fast quasi-shear), and c (slow quasi-shear), for doubly rotated plates of orientation (YXwl) $\phi/\theta$. FIGS. 6, 7 and 8 give the values of $|k_m|$, the piezoelectric coupling factors, for m=a, b and c modes, respectively for GaAs.

Once the plate thickness is known, FIG. 5 determines the approximate anti-resonance frequencies of the three plate mode families, for a particularly oriented crystal cut. FIGS. 6, 7, and 8 determine whether or not the cut can be piezoelectrically driven, and how strongly in each particular mode. It will be seen that for GaAs, the maximum coupling factor is about 6% for the fast shear propagating in the [110] direction; the coupling maximum for the longitudinal mode propagating along [111] is about 4.5%. The slow shear maximum coupling factor is about 3.5%. These values are to be contrasted with the piezoelectric coupling factor of about 9% for AT-cut quartz. It will also be seen that the excitation of GaAs is somewhat weaker than that of quartz, but the effect is of comparable magnitude. The same is true of many of the other II-VI and III-V compounds. These materials are thus suitable for measurement by the measurement technique disclosed and claimed herein.

An additional feature of the method according to the invention is that it is possible to adapt the technique to the measurement of mobilities. As discussed in the literature, the mobility enters the expression for the "effective" elastic stiffnesses, and the "effective" piezoelectric and dielectric constants (all being complex) of the semiconductor. These "effective" values are actually not constants, but are known functions of frequency. By measuring the modal immittances at different harmonics, the frequency dependence can be measured, and the mobility determined.

In addition to the adjustable "air gap" fixture shown in FIG. 1, for the purposes of testing in a factory it may be advantageous to provide a device having fixed air gaps. Such a device can be equipped with quartz or Cervit ® shims to maintain the air gaps accurately. For one-at-a-time testing, a simple, electrically and optically shielded box with a hinge will suffice, but for mass production purposes a shielded enclosure with entrance and exit ports may be provided as part of a conveyor belt assembly line, as shown in FIGS. 9 and 10.

As shown in this embodiment of the invention, wafers 41 to be tested enter via a first, horizontal conveyor belt 42, supported by rollers 43—43, only one of which is shown in the drawing. The wafers are then gripped at their outer edges by a pair of vertical conveyor belts 44, 46, respectively supported by vertical rollers 47—47 and 48—48, and the wafers are translated along thin dielectric supporting rails 45 and 49 located near the disc edges, leaving the discs free to vibrate acoustically. The wafers then exit via a second, horizontal conveyor belt 51, supported by rollers 52—52, only one of which is shown in the drawing. As wafers are transported by conveyors 44 and 46, they pass between upper and lower electrodes 53 and 54, respectively. The apparatus shown is shielded by an upper and a lower metal enclosure 56 and 57, respectively, and the entire apparatus is positioned within an evacuated vacuum chamber 61. To avoid cluttering the drawings, conventional drive motors for the conveyor belts and the electrical connections to the electrodes have been omitted.

Calculations show that the piezoelectrically excitable extensional mode of a (111) cut GaAs crystal has a first order temperature coefficient of frequency of approximately $-72 \times 10^{-6}$/K and the value for the excitable shear ("b") mode of a (110) cut of GaAs is about $-34 \times 10^{-6}$/K. It is expected that many of the other II-VI and III-V compounds will have similar temperature coefficients. Therefore, it may be advantageous to include heating element 63 within shields 56 and 57 so that, in effect, the measuring apparatus is shielded by placing it in an oven. State of the art ovens are capable of maintaining temperatures of a few milli-kelvins, but such control is probably not needed for the instant application. The reason that the entire apparatus is advantageously placed within a vacuum chamber is that air loading dampens the resonance of vibrators, particularly those operating in the extensional mode (as a (111) cut does). Doubly rotated cuts, where the modes are coupled, usually have vibrations where at least some component of the mechanical motion is normal to the surface and thus susceptible to air dampening. Fortunately, to overcome this difficulty only a very soft vacuum is required; the apparatus making the resonance measurements thus requires some provision for pulling a vacuum, e.g. as might be obtained from a small pump 71 connected to vacuum chamber 61.

Figure 9:
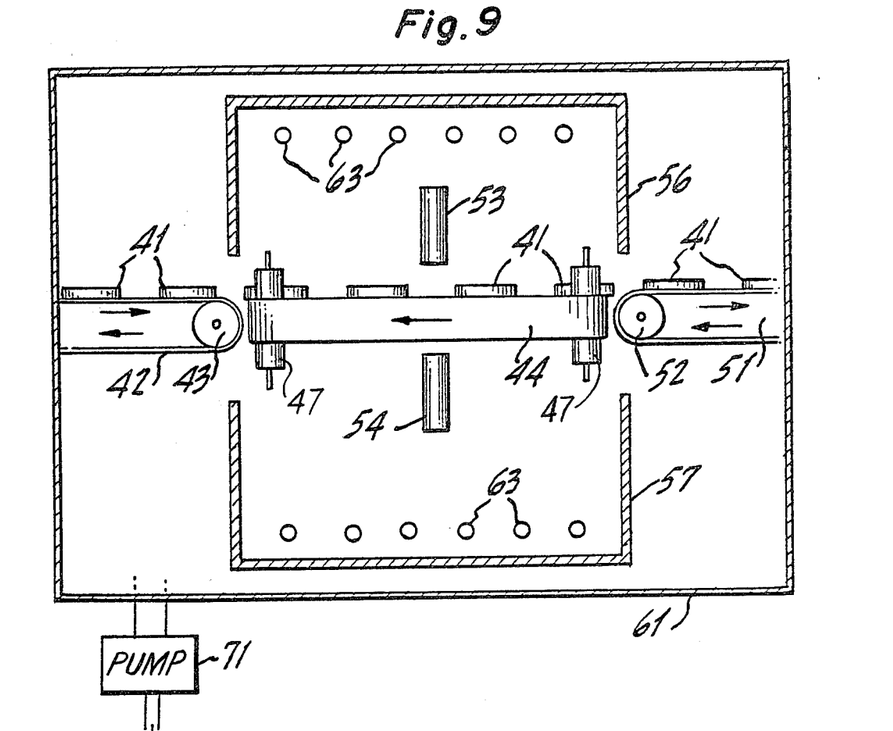
FIG. 9 is a side view of another embodiment of the invention in which a plurality of crystals are transported by conveyor belts through the air gap.
Figure 10:
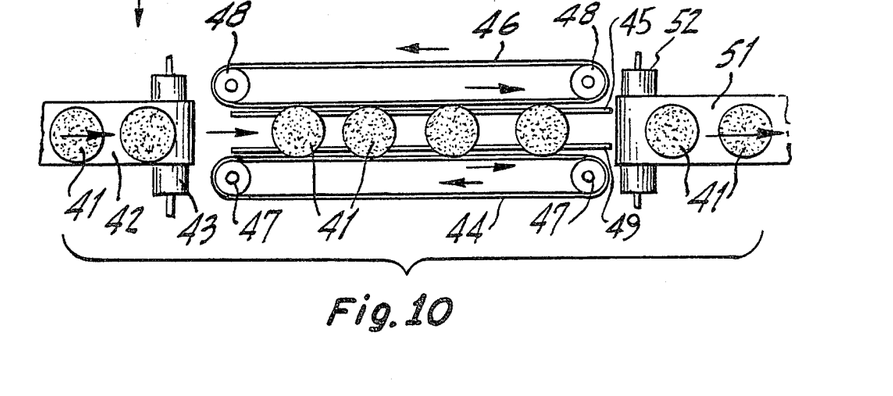
FIG. 10 is a partial top view of the apparatus shown in FIG. 9.

In a manner substantially similar to that shown in FIGS. 2 and 3, the apparatus shown in FIGS. 9 and 10 could be modified to have electrodes 53 and 54 mechanically mounted so that they could translate back and forth from side to side to measure wafers 41 over their entire area, as the wafers pass through the air gap. Alternatively, lower electrode 54 can be fixed and made of larger size.

One skilled in the art may make various changes and substitutions without departing from the spirit and scope of the invention.

What is claimed is:

1. A non-destructive, contactless method of measuring the resistivity of a semiconducting crystalline material, which comprises the steps of:
   (a) supporting a disc of said semiconducting crystalline material in an air gap in such a manner that the disc is free to vibrate;
   (b) establishing an alternating electric field in said air gap thereby to cause said disc to vibrate piezoelectrically;
   (c) adjusting the frequency of said alternating electric field to drive said disc into and beyond resonance; and
   (d) comparing the current drawn by said disc in step (c) above with previously prepared characteristic graphs for said crystalline material thereby to determine the resistivity of the sample under test.

2. The method according to claim 1 wherein said supporting step comprises:
   (e) positioning said disc on an insulating support member located between first and second excitation electrodes, said support member being dimensioned to support said disc only along the outer periphery thereof.

3. The method according to claim 1 including the further step of:
   (e) adjusting the size of said air gap to optimize the piezoelectric vibration of said disc.

4. The method according to claim 1 including the further step of:
   (e) shielding the air gap and semiconducting disc from extraneous electric fields.

5. The method according to claim 1 including the further step of:

(e) establishing a vacuum around at least the air gap and the semiconducting disc.

6. The method according to claim 1 including the further step of:
(e) establishing relative motion between the disc and the electrodes thereby to measure the resistivity of different regions of said disc.

7. Apparatus for the non-destructive, contactless measurement of the resistivity of a semiconducting crystalline material, which comprises:
(a) first and second, spaced apart electrodes, said electrodes defining an air gap therebetween;
(b) means for positioning a disc of said semiconductive material within said air gap; and
(c) means, connected to said electrodes, for establishing an alternating electric field in said air gap, said alternating electric field causing said disc to vibrate piezoelectrically, said field establishing means including means for measuring the current flowing through said air gap.

8. The apparatus according to claim 7 wherein said disc positioning means comprising:
(a) a non-conductive holder dimensioned to support said disc only about the outer periphery thereof, whereby said disc is free to vibrate.

9. The apparatus according to claim 7 further comprising:
(d) means for altering the distance between said electrodes, thereby to alter the size of said air gap.

10. The apparatus according to claim 7 further comprising:
(d) means for establishing relative motion between said electrodes and said disc, whereby the resistivity of said disc is measured at several locations in the disc.

11. The apparatus according to claim 7 wherein said field establishing means includes:
(d) means for altering the frequency of said electric field, thereby to drive said disc into and through resonance.

12. The apparatus according to claim 7 further comprising:
(d) means for electrically shielding said air gap and said disc from external electrical fields.

13. The apparatus according to claim 7 further comprising:
(d) means for establishing a vacuum around at least the air gap and the disc.

14. The apparatus according to claim 7 wherein said positioning means further comprises:
(d) a first conveyor belt, positioned normal to the electric field established by said electrodes, for transporting said disc toward said air gap;
(e) second and third, spaced-apart conveyor belts, positioned parallel to the electric field established by said electrodes, for receiving said disc from the discharge end of said first conveyor belt and transporting the same, along insulating rails, through said air gap, said disc being gripped by said second and third conveyor belts only at two points on the periphery thereof such that said disc is free to vibrate in the air gap; and
(f) a fourth conveyor belt, positioned normal to the electric field established by said electrodes, for receiving said disc from the discharge end of said second and third conveyor belts, and for transporting said disc away from said air gap.

* * * * *